United States Patent [19]
Bracchitta et al.

[11] Patent Number: 5,518,945
[45] Date of Patent: May 21, 1996

[54] METHOD OF MAKING A DIFFUSED LIGHTLY DOPED DRAIN DEVICE WITH BUILT IN ETCH STOP

[75] Inventors: John A. Bracchitta, South Burlington; Gabriel Hartstein, Burlington; Stephen A. Mongeon, Essex Junction, all of Vt.; Anthony C. Speranza, Austin, Tex.

[73] Assignee: International Business Machines Corporation, Armonk, N.Y.

[21] Appl. No.: 435,262

[22] Filed: May 5, 1995

[51] Int. Cl.⁶ .................................. H01L 21/265
[52] U.S. Cl. ................... 437/44; 437/41 D; 437/40; 437/149; 437/153; 437/154; 437/160; 437/164; 148/DIG. 144
[58] Field of Search ...................... 437/149, 153, 437/154, 158, 160, 164, 44, 41 RLD, 40 SW, 41 SW, 950; 148/DIG. 144, DIG. 157

[56] References Cited

U.S. PATENT DOCUMENTS

| | | | |
|---|---|---|---|
| 4,204,894 | 5/1980 | Komeda et al. | 437/161 |
| 4,209,350 | 6/1980 | Ho et al. | 148/188 |
| 4,240,845 | 12/1980 | Esch et al. | 148/1.5 |
| 4,502,202 | 3/1985 | Malhi | 437/162 |
| 4,546,535 | 10/1985 | Shepard | 437/160 |
| 4,597,824 | 7/1986 | Shinada et al. | 156/643 |
| 4,603,468 | 8/1986 | Lam | 437/164 |
| 4,628,589 | 12/1986 | Sundaresan | 437/164 |
| 4,837,179 | 6/1989 | Foster et al. | 437/160 |
| 4,912,061 | 3/1990 | Nasr | 437/44 |
| 4,996,168 | 2/1991 | Ozaki et al. | 437/164 |
| 5,024,959 | 6/1991 | Pfiester | 437/34 |
| 5,032,532 | 7/1991 | Mori et al. | 437/41 |
| 5,179,034 | 1/1993 | Mori et al. | 437/41 |
| 5,262,339 | 11/1993 | Mori et al. | 437/41 |
| 5,324,686 | 6/1994 | Tsunashima | 437/154 |
| 5,434,444 | 7/1995 | Yoshitomi et al. | 257/344 |

FOREIGN PATENT DOCUMENTS

| | | | |
|---|---|---|---|
| 0273918 | 11/1989 | Germany | 437/154 |
| 4211999 | 10/1992 | Germany . | |
| 5444482 | 4/1979 | Japan . | |
| 0074681 | 4/1985 | Japan | 437/164 |
| 0043477 | 3/1986 | Japan . | |
| 0001939 | 1/1990 | Japan | 437/164 |
| 0365327 | 12/1992 | Japan . | |

OTHER PUBLICATIONS

C. S. Oh et al.; "Simultaneous Formation of Shallow–Deep Stepped Source/Drain for Sub–Micron CMOS", 1988.
Tomohisa Mizuno et al.; "Si₃N₄/SiO₂ Spacer Induced High Reliability in LDDMOSFET and Its Simple Degradation Model", 1988 *International Electron Devices Meeting*, Dec. 1988.

*Primary Examiner*—Trung Dang
*Attorney, Agent, or Firm*—Whitham, Curtis, Whitham & McGinn; Howard J. Walter

[57] ABSTRACT

A method of fabricating a lightly doped drain MOSFET device with a built in etch stop is disclosed. After forming a gate electrode on a substrate through conventional methods, a conformal doped layer is deposited on the gate electrode. A conformal layer of nitride is then deposited on the conformal doped layer. The nitride layer is etched, with the etch stopping on the conformal doped layer, thereby forming nitride spacers. Deep source and drain regions are formed by either ion implantation or diffusion. The device is then heat treated so that light diffusion occurs under the nitride spacers and heavy diffusion occurs outside the spacer region. The method is applicable to N-substrate (P-channel), P-substrate (N-channel), and complementary metal oxide semiconductor (CMOS) devices.

9 Claims, 2 Drawing Sheets

METHOD OF MAKING A DIFFUSED LIGHTLY DOPED DRAIN DEVICE WITH BUILT IN ETCH STOP

BACKGROUND OF THE INVENTION

1. Field of the Invention

The present invention generally relates to a method of making a diffused Lightly Doped Drain (LDD) semiconductor device, and, more particularly, to a LDD Metal Oxide Semiconductor Field Effect Transistor (MOSFET) with low junction leakage.

2. Description of the Related Art

The present invention is applicable to conventional CMOS devices, and in particular to dynamic memory devices. Static memory cells store data as a stable state of a flip-flop device. The data is retained as long as dc power is supplied to the device. On the other hand, dynamic memory cells store binary data as charge on a capacitance.

The typical dynamic array, for example, a Dynamic Random Access Memory (DRAM) array, is composed of a large numbers of memory cells arranged in a matrix of rows (word lines) and columns (bit lines), each of which contains a transistor and a capacitance. Each row-column intersection stores one byte of information as a "zero" or "one". Normal leakage currents can remove stored charge in a few milliseconds (ms), so dynamic memories require periodic restoration, or refreshing, of stored charge, typically every 2–4 ms. Refreshing is performed by reading the stored data before it leaks away or every time it is read, inverting the result, and writing it back into the same location.

Retention time (RT) specifications are becoming more stringent for succeeding generations of DRAMs, that is, present DRAM applications require longer RT for low power and battery back-up applications.

As succeeding generations of DRAMs increase in memory capacity from 64 Mbit to 256 Mbit and beyond, the scaling down of the channel length and source/drain junction depth are the major challenges in improving MOSFET performance and density. Because of the limited resolution of optical lithography, realizing a sub-quarter micron gate length usually requires X-ray lithography or electron beam lithography. Both processes, however, are costly, and E-beam lithography is also time consuming.

Shallow/deep source-drain regions have been formed simultaneously through the use of a disposable nitride spacer to cream an implant screen-oxide step, as reported in C. S. Oh et al., "Simultaneous Formation of Shallow-Deep Stepped Source/Drain for Sub-Micron CMOS", 1988 *Symposium on VLSI Technology*, May 1988. Summarizing, the shallow junction was formed next to the polysilicon gate for short channel control, and the deeper junction was formed further away from the gate region for silicide formation.

Shallow, lightly doped drain regions are also effective in controlling so-called "hot carrier" effects, preventing carriers from gaining sufficient energy to impinge into the oxide layer.

It has been found, however, that the nitride spacer etch process is a large contributor to silicon defects and RT fails. In addition, scaling the gate oxide thickness, $T_{ox}$, increases the electric field in the LDD overlap region of the device, resulting in larger Gate Induced Drain Leakage (GIDL) current for a given defect density in the overlap region.

In light of the foregoing, there exists a need for a process to scale down the channel length and source/drain junction depth while decreasing silicon crystalline defect densities in the diffusion pocket and gate overlap regions. This would allow the RT to be extended, perhaps approaching one second.

SUMMARY OF THE INVENTION

The present invention is directed to a method of making a LDD MOSFET with low junction leakage by using Boron Silicate Glass (BSG) or Phosphorous Silicate Glass (PSG) as both a LDD diffusion source and as a nitride spacer etch stop, which substantially obviates one or more of the problems due to the limitations and disadvantages of the related art.

The resulting structure contains shallow and deep source-drain regions with reduced crystalline defects and low junction leakage. To achieve these and other advantages and in accordance with the purpose of the invention, as embodied and broadly described, the invention provides a method of fabricating a lightly doped drain MOSFET device, the method comprising the steps of: forming a gate electrode on a substrate; depositing a first conformal doped layer on the gate electrode; depositing a conformal layer of nitride on the first conformal doped layer; etching the nitride layer to form nitride spacers, the etching stopping on the first conformal doped layer; forming deep source and drain regions; and heat treating the device so that light diffusion occurs under the nitride spacers and heavy diffusion occurs outside the spacer region.

In another aspect of the invention, an oxide layer formed after the gate electrode is fabricated may be left in place during subsequent processing, rather than being removed prior to deposition of the conformal doped layer.

It is to be understood that both the foregoing general description and the following detailed description are exemplary and explanatory and are intended to provide further explanation of the invention as claimed.

BRIEF DESCRIPTION OF THE DRAWINGS

The foregoing and other objects, aspects and advantages will be better understood from the following detailed description of a preferred embodiment of the invention with reference to the drawings, in which.

It is understood that the each of the above Figures are not drawn to scale and that various parts are exaggerated for illustrative and explanatory purposes. The particular device dimensions can readily be ascertained by one of skill in the art to which the invention pertains.

DETAILED DESCRIPTION OF AN EMBODIMENT OF THE INVENTION

Figure 1A:
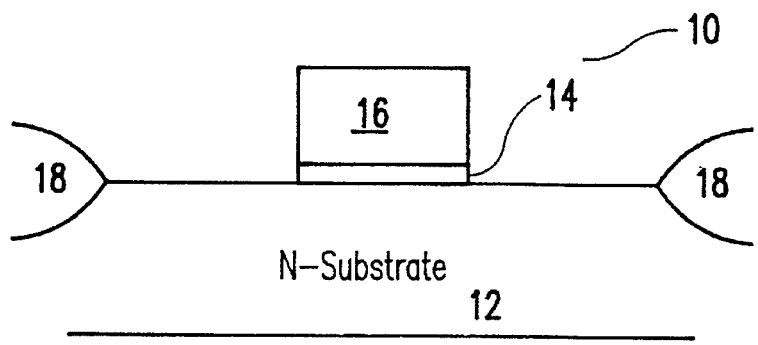
FIG. 1A is a cross-sectional view of a gate electrode formed by a conventional N-substrate (P-channel) semiconductor process.
Figure 1B:
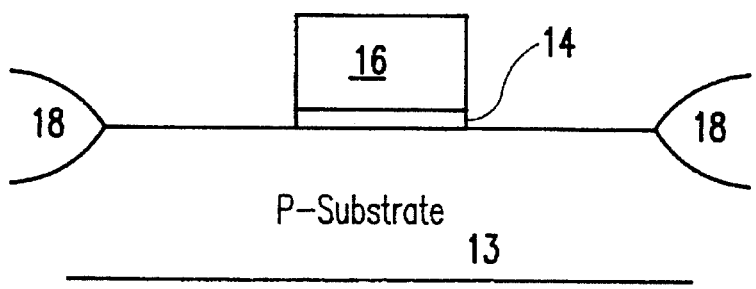
FIG. 1B is a cross-sectional view of a gate electrode formed by a conventional P-substrate (N-channel) semiconductor process.
Figure 1C:
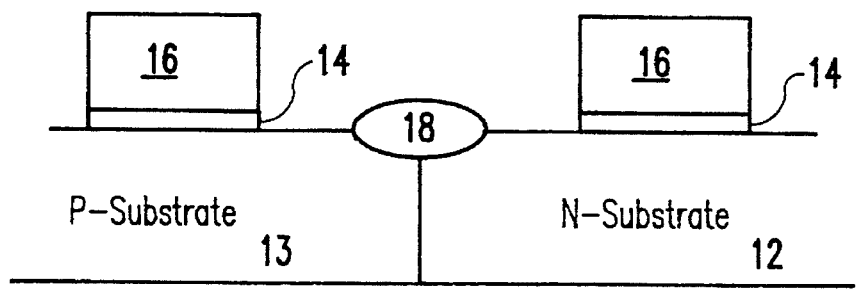
FIG. 1C is a cross-sectional view of gate electrodes formed by a conventional CMOS semiconductor process.

Referring now to the drawings, and more particularly to FIG. 1A, there is shown a cross-sectional view of a semiconductor structure, designated generally as reference numeral 10. As embodied herein and referring to FIG. 1A, the structure 10 includes an N-substrate (P-channel) device 12 having a gate oxide layer 14 and polysilicon gate electrode 16 formed thereon. Field oxide regions 18 would isolate one device from another. As discussed further below, the method of the present invention can also be used to form a P-substrate (N-channel) device as shown in FIG. 1B, or a CMOS device as shown in FIG. 1C.

The initial steps in the process by which the semiconductor substrate and gate electrode are prepared are not illustrated and neither are the final steps in the fabrication sequence as both can be done in a conventional manner. Many alternate and conventional ways exist for implementing these initial and final steps, any number of which can be combined with the process of the present invention to produce a completed device.

The process of the present invention will now be described with respect to an N-substrate (P-channel) device as depicted in FIG. 1A. Initially, after forming the gate electrode 16, the exposed silicon surfaces are dry oxidized at a low temperature, about 800° C. for example, to form a thin 100 Å sidewall oxide layer 19 (see FIG. 6). This thin sidewall oxide layer 19 is grown to clean up the substrate surface and repair any damage to the substrate surface or the gate electrode caused by previous patterning and etching steps in forming the gate electrode.

The sidewall oxide layer 19 is then etched utilizing a buffered hydrofluoric (HF) acid wet etch, thereby removing the oxide layer 19 prior to further processing.

Figure 2:
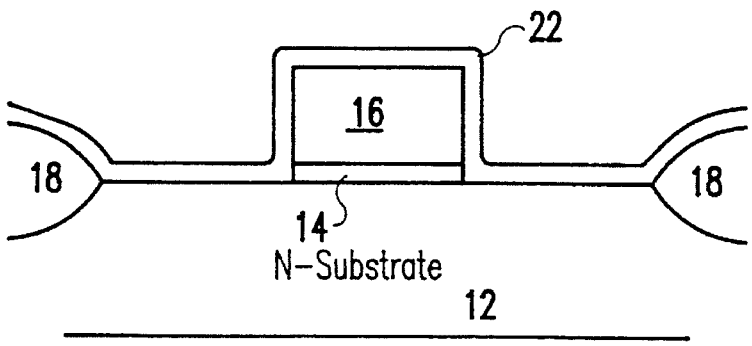
FIG. 2 is a cross-sectional view of the P-channel device of FIG. 1A showing a conformal layer of doped glass deposited over the structure.

In the next step of the process, a conformal layer of doped glass 22 is then deposited over the structure as shown in FIG. 2. The doped glass may be, for example, Boron Silicate Glass (BSG) for a P-channel MOSFET. The doped glass layer 22 is utilized in subsequent steps as both a dopant source for the formation of source and drain regions, and as an etch stop for a nitride layer etch step. The percentage of boron in the BSG and the layer thickness can be adjusted to obtain the desired junction extension or junction profile.

Figure 3:
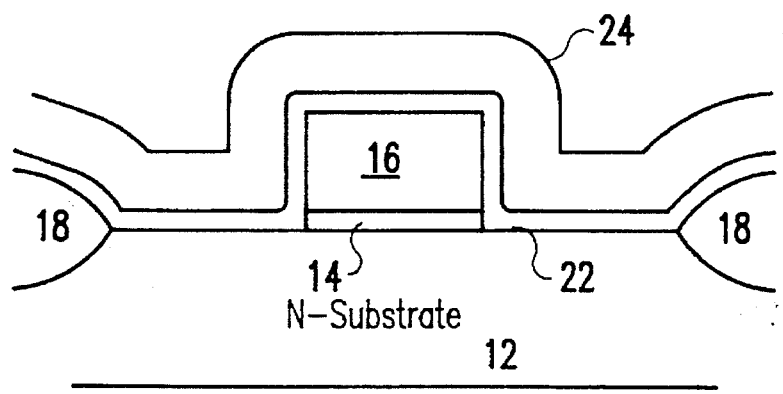
FIG. 3 is a cross-sectional view of the P-channel device of FIG. 2 showing a conformal layer of nitride deposited thereon.

The formation of the nitride spacers will now be described. After the conformal doped glass BSG layer 22 is deposited, a conformal layer of nitride 24 is blanket deposited, by Low Pressure Chemical Vapor Deposition (LPCVD), over the substrate and gate electrode at a thickness of about 1700 Å, for example. See FIG. 3. It is understood that the thickness of the layer may be adjusted to achieve the resulting desired spacer width.

The nitride layer 24 is then etched using reactive ion etching (RIE), with the oxide etch stop being the doped glass layer 22 (BSG). An important benefit to etch stopping on the BSG is that it prevents RIE damage to the silicon substrate in the critical source/drain (S/D) regions. A buffered HF wet etch then removes the BSG everywhere except under the nitride spacer. The resulting structure is shown in FIG. 4.

After formation of the nitride spacers according to the method of the present invention, deep, highly doped junction regions 32 (see FIG. 5) must be formed. These highly doped regions 32 are later used for contacting subsequently formed metal layers.

Figure 4:
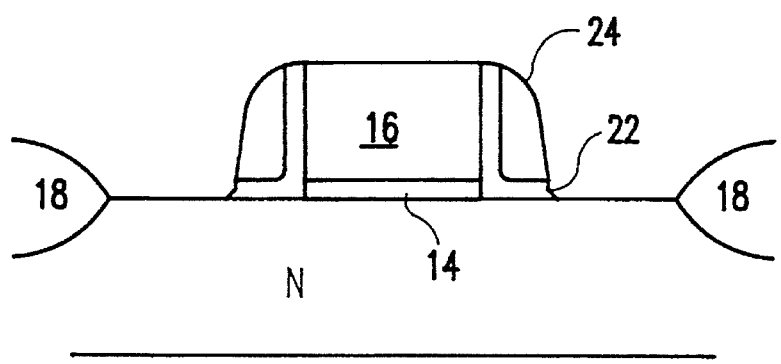
FIG. 4 is a cross-sectional view of the P-channel device of FIG. 3 after the nitride layer is etched.

One option for fabricating fully diffused junction regions may be exercised by initially applying a second conformal doped layer (e.g., BSG) over the structure shown in FIG. 4 to act as a high concentration dopant source. The BSG would then be removed from the N-channel areas using conventional lithography and wet etching, for example with a buffered HF solution.

If crystal defect levels are not the primary consideration, a second option would be to use conventional photolithography techniques to block the N-channel device regions with resist and allow for high dose, $BF_2$ ion implantation into the exposed P-channel regions.

Figure 5:
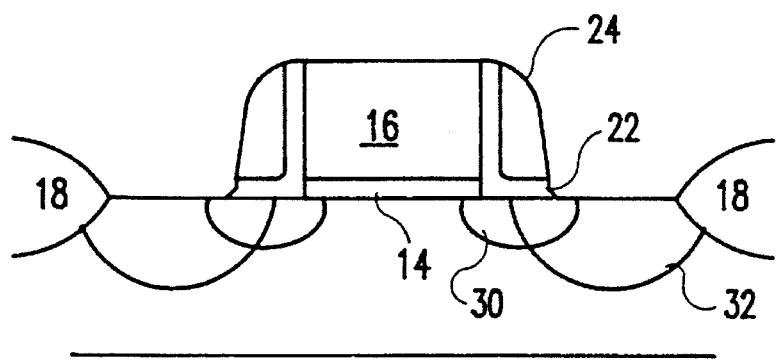
FIG. 5 is a cross-sectional view of the P-channel device of FIG. 4 showing shallow and deep source and drain regions after a high temperature anneal.

Regardless of which of the above options were selected for the formation of the deep, highly doped regions 32 shown in FIG. 5, a high temperature activation or drive-in anneal will be required. This anneal will also serve as the drive-in anneal for the region under the nitride spacers by which the lightly doped drain (LDD) areas 30 are formed. The anneal would typically be performed at a range of about 900°–1000° C. to obtain the desired junction profiles in the deep regions as well as the shallow diffused LDD (DLDD) source-drain regions.

The junction is shallower near the gate edge because the dopant concentration in the BSG under the nitride spacer is reduced. Deeper junctions are formed away from the gate during the ion implant or second BSG deposition due to higher dopant concentrations.

Several advantages favor the use of DLDDs over ion implantation methods. First, the conformal deposition of BSG will correct for a recursive sloped polysilicon gate electrode (i.e., the upper portion of the gate electrode flares out), while conventional ion implantation methods can not. A second benefit is that DLDDs do not have a problem with shadowing due to the 7° angle of ion implantation required to prevent lattice channeling.

Still another benefit is that as junction depths decrease with new, higher density technologies, one can form a higher dose, lower resistance, higher performance device with diffused rather than implanted junctions. Moreover, one can form a shallower, more controllable junction with diffusion since ion implant channeling is not a problem.

While the above process has been described with respect to the manufacture of a P-channel device, it is understood that the process is equally applicable, with minor modifications, to the formation of N-channel (FIG. 1B) or complementary metal oxide semiconductor (CMOS) devices (FIG. 1C).

For example, with an N-channel device as in FIG. 1B, the conformal layer 22 would consist of Phosphorous Silicate Glass (PSG) or arsenic doped glass, rather than the BSG used for the P-channel MOSFET of FIG. 1A. All of the other process steps would remain essentially the same. Of course, for CMOS devices, conventional photolithography techniques could be used to block either the N- or P-channel device regions in accordance with the purpose of the invention.

Figure 6:
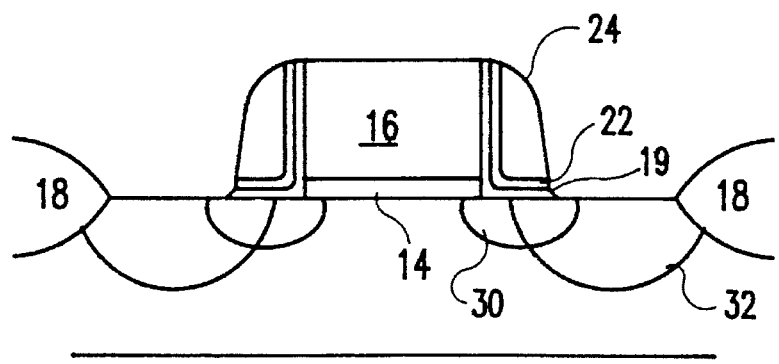
FIG. 6 is a cross-sectional view of an alternate embodiment of FIG. 5 that includes an oxide layer under the conformal doped layer.

Another embodiment of the invention will now be described. As with the first embodiment, this second embodiment is equally applicable to P-channel, N-channel, and CMOS devices. This second embodiment differs from the first embodiment in that the step of removing the oxide layer 19 by a wet etch is omitted, thereby leaving a thin sidewall oxide layer 19 under the conformal doped layer 22 in the completed device as shown in FIG. 6.

While the process steps for both embodiments are essentially the same, there are some minor variations. For example, in the "sidewall" P-channel embodiment of FIG. 6, the boron concentration (phosphorous or arsenic concentrations in a N-channel device) and film thickness would have to be increased—over that normally required in the "non-sidewall" embodiment of FIG. 5—to achieve a similar junction profile. This is due to the fact that the sidewall oxide layer 19 acts as a diffusion barrier, retarding the out diffusion.

In summary, both embodiments of this invention combine the above identified advantages of a diffused lightly doped drain device, with a robust oxide layer (e.g., BSG or PSG/arsenic) to act as an etch stop during the nitride spacer formation. The etch stop feature ensures that at no time during the nitride spacer etch process will the high energy plasma contact the silicon substrate in the critical areas surrounding the device source-drain. A diffused, non-ion implanted LDD region coupled with a silicon substrate virtually free from high energy plasma damage will produce high quality, low level leakage devices for use in future DRAM and low power battery applications.

While the invention has been described in terms of the embodiments described above, those skilled in the art will recognize that the invention can be practiced with modification within the spirit and scope of the appended claims.

Having thus described my invention, what we claim as new and desire to secure by Letters Patent is as follows:

1. A method of fabricating a lightly doped drain MOSFET device, the method comprising the steps of:

forming a gate electrode on a substrate;

depositing a first conformal doped layer on the gate electrode;

depositing a conformal layer of nitride on the first conformal doped layer;

etching the nitride layer to form nitride spacers, said etching stopping on the first conformal doped layer;

removing said first conformal doped layer everywhere except under said nitride spacers;

forming deep source and drain regions; and heat treating the device so that light diffusion occurs under the nitride spacers and heavy diffusion occurs outside the spacer region.

2. A method as recited in claim 1, wherein the first conformal doped layer is Boron Silicate Glass (BSG) and the device is a P-channel MOSFET.

3. A method as recited in claim 1, wherein the first conformal doped layer is selected from the group consisting of Phosphorous Silicate Glass (PSG) and arsenic doped glass, and the device is an N-channel MOSFET.

4. A method as recited in claim 1, wherein the deep source and drain regions are formed by ion implantation.

5. A method as recited in claim 1, further including the step of depositing a second conformal doped layer after the nitride spacers are formed.

6. A method as recited in claim 5, wherein the deep source and drain regions are formed by diffusion.

7. A method recited in claim 1, wherein the heat treating step is performed at a temperature of about 900°–1000° C.

8. A method as recited in claim 1, wherein the device is a complementary metal oxide semiconductor (CMOS) device.

9. A method recited in claim 1, further including the step of oxidizing surfaces of the gate electrode prior to depositing the first conformal doped layer on the gate electrode.

* * * * *